United States Patent [19]

Iizuka

[11] Patent Number: 5,756,401
[45] Date of Patent: May 26, 1998

[54] PROCESS FOR THE ETCHING OF POLYCIDE FILM

[75] Inventor: Katsuhiko Iizuka, Kawasaki, Japan

[73] Assignee: Fujitsu Limited, Kawasaki, Japan

[21] Appl. No.: 27,634

[22] Filed: Mar. 8, 1993

[30] Foreign Application Priority Data

Mar. 23, 1992 [JP] Japan .................... 4-065305

[51] Int. Cl.$^6$ .................... H01L 21/30
[52] U.S. Cl. .................... 438/719; 438/721; 438/737
[58] Field of Search .................... 156/643, 646, 156/656, 655, 657, 661.1, 659.1, 643.1, 646.1, 656.1, 655.1, 657.1, 661.11, 659.11; 438/721, 736, 373, 719

[56] References Cited

U.S. PATENT DOCUMENTS

| | | | |
|---|---|---|---|
| 4,184,909 | 1/1980 | Chang et al. | 156/643 |
| 5,013,398 | 5/1991 | Long et al. | 156/643 |
| 5,118,387 | 6/1992 | Kadomura | 156/643 |
| 5,160,407 | 11/1992 | Latchford et al. | 156/643 |
| 5,246,529 | 9/1993 | Fukasawa et al. | 156/643 |
| 5,256,245 | 10/1993 | Keller et al. | 156/643 |

FOREIGN PATENT DOCUMENTS

| | | |
|---|---|---|
| 0328350 | 8/1989 | European Pat. Off. |
| 02224241 | 9/1990 | Japan |
| 03082120 | 4/1991 | Japan |
| 04298035 | 10/1992 | Japan |

OTHER PUBLICATIONS

"Etch Rate For Tungsten–Comprises Spin On–Glass–Material For High Etch Rate Ratio To Boron–Phosphorus–Silicon Glass", Anonymous; RD–291014; Jul. 10, 1988.

*Primary Examiner*—R. Bruce Breneman
*Assistant Examiner*—George Goudreau
*Attorney, Agent, or Firm*—Staas & Halsey

[57] ABSTRACT

There is provided a process of dry etching of a double-layer film composed of a polycrystal silicon film and a metal silicide film formed on a base substance with an etching-proof film composed of an inorganic compound as a mask in a state that reaction gas loaded with at least any one of HBr gas, $Br_2$ gas and $BBr_3$ gas is activated by plasma discharge, and the temperature of the base substance is maintained at 60° C. or higher. With this, it is possible to aim at improvement of dimensional controllability and selectivity of etching without using flon gas, and further to arrange so that the configuration after etching of an object to be etched does not depend on an area ratio on a wafer of the area of a region where an etching-proof film is formed to the exposed area of the object to be etched.

18 Claims, 9 Drawing Sheets

PROCESS FOR THE ETCHING OF POLYCIDE FILM

BACKGROUND OF THE INVENTION

1. Field of the Invention

The present invention relates to a process for etching a polycide film, and more particularly to a process of dry etching of a double-layer film composed of a polycrystal silicon film and a metal silicide film formed on a base substance.

2. Description of the Related Art

Etching techniques producing little lateral etching of an object to be etched, being superior in forming a perpendicular sectional configuration and having high selectivity of etching between the object to be etched and an insulating film of a substrate are demanded in recent years for the purpose of forming a fine pattern with the densification of a semiconductor device.

Conventionally, flon gas has been used in many cases for the etching of a polycide film such as one composed of a polycrystal silicon film and a tungsten silicide film. However, since the flon gas has become a subject of control for the purpose of preservation of the environment, it is being examined to use gas loaded with bromine (Br).

FIG. 1A and FIG. 1B are sectional views for explaining a process for etching a polycide film composed of a polycrystal silicon film (poly-S film) and a tungsten silicide film ($WSi_x$ film) according to the related art.

As shown in FIG. 1A, after forming a silicon oxide film 52 on a silicon substrate 51 first, a polycrystal silicon film 53 and a tungsten silicide film 54 are formed successively on a silicon oxide film 52. These films constitute an object to be etched 55. Then, the object to be etched 55 is etched with etching gas loaded with bromine (Br), e.g., a $Cl_2$/HBr gas mixture or a $SF_6$/HBr gas mixture with a photoresist film 56 as a mask.

At this time, the photoresist film 56 which is a mask material is also etched along with the etching of the object to be etched 55. Further, carbon is supplied from the photoresist film 56 during etching, and a protecting film for preventing lateral etching composed of a carbon compound as a reaction product 57 is formed on side walls of the photoresist film 56 and the tungsten silicide film 54. The lateral etching of the object to be etched 55 is prevented by means of this protecting film.

However, there is such a problem that, when the photoresist film 56 is used as a mask and the tungsten silicide film 54 is dry-etched using gas loaded with bromine, in particular HBr gas or $Br_2$ gas as shown in FIG. 1A, the reaction product adheres onto the side wall of the photoresist film 56 and the tungsten silicide film 54 excessively as shown in FIG. 1B, thus preventing etching.

Further, even when the tungsten silicide film 54 could be etched completely and removed, the reaction products adhere to the side wall of the photoresist film 56 in succession during etching and the effective width of the photoresist film 56 becomes wider as the etching progresses. Therefore, there is such a problem that the configuration of the tungsten silicide film 54 after etching shows a tapered form and becomes different from the configuration of the mask pattern.

Furthermore, reaction products which have once adhered are generally difficult to be removed, thus producing such a problem that, although the adhered reaction products can be removed by etching after RF power is increased so as to heighten sputtering effects, residues by the etching of the tungsten silicide film are produced or the selectivity of etching between the tungsten silicide film 54 and the silicon oxide film 52 is not obtainable.

Further, in case the etching of the object to be etched 55 is prevented by the protecting film, the photoresist film 56 is subjected to excessive etching relatively. Thus, such a problem is also caused that excessive resist loss and shrinkage are produced, resulting in poor dimensional control of the pattern.

Moreover, there is also such a problem that a difference is produced in the configuration of the object to be etched after etching depending on the area ratio con a wafer of the area of the region on a wafer where the photoresist film 56 is formed to the area of non-forming region where the photoresist film 56 is not formed.

SUMMARY OF THE INVENTION

It is an object of the present invention to provide, in a process for dry-etching a double-layer film composed of a polycrystal silicon film and a metal silicide film formed on a base substance, an etching process which is able to improve the dimensional controllability in etching and the selectivity of etching between an object to be etched and a substrate film and to arrange so that the configuration of the object to be etched does not depend on the dimension of a pattern of a mask without using gas which violates the flon gas regulations.

According to the present invention, etching is performed with an etching-proof film composed of an inorganic compound as a mask in a state that the reaction gas is activated by plasma discharge using reaction gas containing at least any of HBr gas, $Br_2$ gas and $BBr_3$ gas and the temperature of the base substance is maintained at 60° C. or higher. Accordingly, a proper protecting film containing no carbon is formed on the side wall of the object to be etched composed of a double-layer of a polycrystal silicon film and a metal silicide film, thus making it possible to form the sectional configuration after etching of the object to be etched into an almost perpendicular sectional configuration without using flon gas.

Further, since the base substance is heated, it is possible to maintain an etching rate of the metal silicide film at a practical value.

Furthermore, it is possible to control the sectional configuration of the object to be etched after etching by maintaining the temperature of the base substance at 60° C. or higher. With this, it becomes possible to arrange so that no difference is produced in the configuration of the object to be etched after etching depending on the area ratio on the object to be etched of the forming region to the non-forming region of the etching-proof film.

As a concrete example of the metal silicide film, a tungsten silicide film or a molybdenum silicide film is used.

Further, as a concrete example of the etching-proof film composed of an inorganic compound, a silicon oxide film ($SiO_2$ film), a silicon nitride film ($Si_3N_4$ film), a phosphosilicate glass film (PSG film), a borosilicate glass film (BSG film), a borophosphosilicate glass (BPSG) film or a spin on glass (SOG) film is used.

Further, reaction gas containing neither fluorine nor chlorine is used as reaction gas. With this, higher selectivity between the object to be etched and a substrate film is obtainable.

Furthermore, a gas mixture added with at least one of rare gas, gas loaded with oxygen, gas loaded with nitrogen and gas loaded with hydrogen is used as reaction gas. In particular, plasma is generated more easily by adding rare gas to the reaction gas, thus making it possible to promote ionization of the reaction gas even if the pressure of the reaction gas loaded with bromine is increased. Accordingly, it is possible to aim at improvement of etching selectivity by increasing the pressure of the reaction gas loaded with bromine while preventing decrease in the uniformity of the etching rate in the wafer due to uniformalization of generation of plasma.

Further, as a concrete example of the rare gas, gas loaded with at least one of He gas, Ne gas, Ar gas, Kr gas and Xe gas is used.

Furthermore, as a concrete example of the gas loaded with oxygen, gas loaded with at least one of $O_2$ gas, $O_3$ gas, $SO_2$ gas and $H_2O$ gas is used.

Moreover, as a concrete example of the gas loaded with nitrogen, gas loaded with at least one of $N_2$ gas, $NH_3$ gas, $N_2H_2$ gas, $NH_3OH$ gas, NO gas and $N_2O$ gas is used.

Further, as a concrete example of the gas loaded with hydrogen, gas loaded with at least one of $H_2$ gas and $H_2S$ gas is used.

DESCRIPTION OF THE PREFERRED EMBODIMENTS (I) Progress until completion of the invention The present inventor has made following investigation for the purpose of solving the problems of etching processes according to the related art when HBr is used in the progress in completing the invention.

First, it was considered to improve the configuration after etching of an object to be etched by rationalization of etching conditions while using a photoresist film as a mask as it is. Namely, as clarified in Japanese Patent Unexamined Publication No. 2-224241, FIG. 3, a taper angle approaches gradually to 90 degrees with the increase of the substrate temperature and can be maintained at approximately 90 degrees within the range of the substrate temperature of 60° to 160° C. in case polycrystal silicon is etched with a photoresist film as a mask. Accordingly, if similar dependency is also obtainable in the case of a tungsten silicon film, it is possible to improve the configuration after etching of an object to be etched by applying etching of a double-layer film composed of a polysilicon film and a tungsten silicon film while maintaining the substrate temperature within a common temperature range where the taper angle shows 90 degrees.

Based on such ideas, it was investigated so as to find out a common temperature range in which the taper angle after etching of an object to be etched becomes approximately 90 degrees in both cases of a polycrystal silicon film and a tungsten silicide film.

Figure 7:
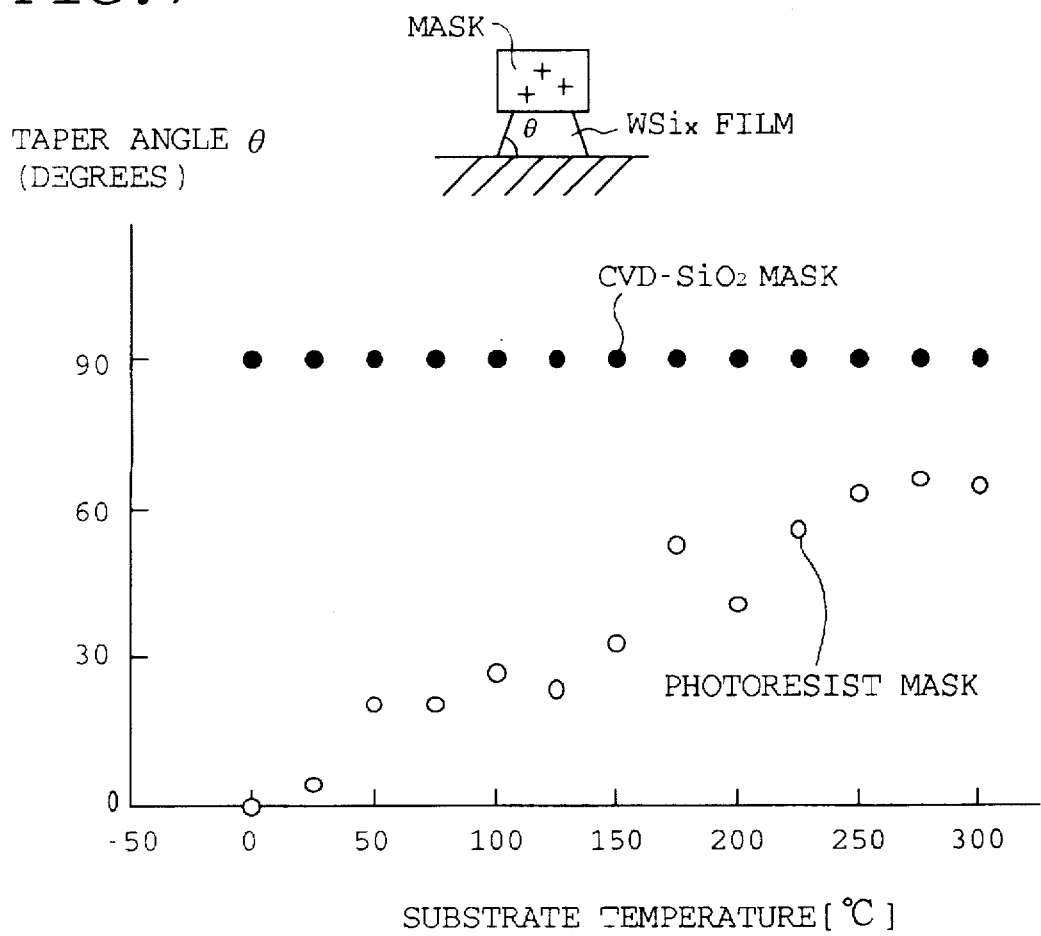
FIG. 7 is a characteristic diagram for explaining a taper angle of a tungsten silicide film after etching versus the substrate temperature when a silicon oxide film and a photoresist film are used as an etching-proof film and a tungsten silicide film is used as an object to be etched.

FIG. 7 is a characteristic diagram showing the results of experiment made by the present inventor, which shows how a taper angle θ of a tungsten silicide film has changed after etching versus the substrate temperature when a tungsten silicide film is etched using a photoresist mask.

According to the results of experiment, the taper angle approaches gradually to 90 degrees as the substrate temperature is risen, but the taper angle is approximately 60 to 70 degrees even at the substrate temperature of 300° C. and does not still reach to 90 degrees. Thus, it was ascertained that a common substrate temperature range in which the taper angle reaches to approximately 90 degrees in the case of the polycrystal silicon film and the case of the tungsten silicide film did not exist.

From the foregoing, such a plan could be framed that, when etching is applied to an object to be etched of a double-layer film composed of a polycrystal silicon film and a tungsten silicide film with a photoresist film as a mask, it is difficult to improve the configuration after etching of an object to be etched only by rationalization of etching conditions, and thus, it is required to form a protecting film composed of an easily removable reaction product and capable of preventing lateral etching.

The possibility of existence and application of such a protecting film was studied thereafter. Namely, it is conceivable that a reaction product composed of rigid C—Br polymer is formed by carbon (C) generated from the photoresist film, and particularly, this reaction product is liable to adhere to a material (a photoresist; film) containing carbon as the reason that a conventional reaction product is liable to be formed on a side wall of the photoresist film and the like and removal of the reaction product is difficult. Based on such ideas, the existence of carbon causes the problem. Therefore, it may be concluded that, if an inorganic compound such as a silicon oxide film and a silicon nitride film containing no carbon or a spin on glass (SOG) film or the like containing very little carbon is used as a mask without using a photoresist film containing carbon, it is possible to prevent formation of a reaction product which is hard to be removed.

The present inventor has made following experiment in order to confirm whether it is possible to prevent formation of a reaction product which is hard to be removed or not, and whether a protecting film is formed thereby enabling to prevent lateral etching or not. Namely, in the experiment, dry etching of a double-layer film composed of a polycrystal silicon film and a metal silicide film was performed using gas loaded with neither fluorine nor chloride but loaded with bromine and using an SOG film containing an inorganic compound or little carbon content as an etching-proof film. In the foregoing, a silicon oxide film was used as the etching-proof film, and gas loaded with at least any one of HBr gas, $Br_2$ gas and $BBr_3$ gas or a gas mixture obtained by adding at least any one of rare gas, gas loaded with oxygen, gas loaded with nitrogen or gas loaded with hydrogen to the gas loaded with bromine was used as the gas loaded with neither fluorine nor chloride but loaded with bromine.

Prior to this experiment, it is required to determine the substrate temperature exerting an influence upon the configuration and the etching rate. Namely, although it is understandable from Japanese Patent Unexamined Publication No. 2-224241, FIG. 3 that it is required to maintain the substrate temperature at 60° C. or higher in order to maintain a taper angle at 90 degrees in the etching of a polycrystal silicon film with a silicon oxide film as a mask, it is not clear how the configuration after etching of the metal silicide film depends on the substrate temperature. Further, it is neither clear how the etching rate of the tungsten silicide film depends on the substrate temperature.

Figure 8:
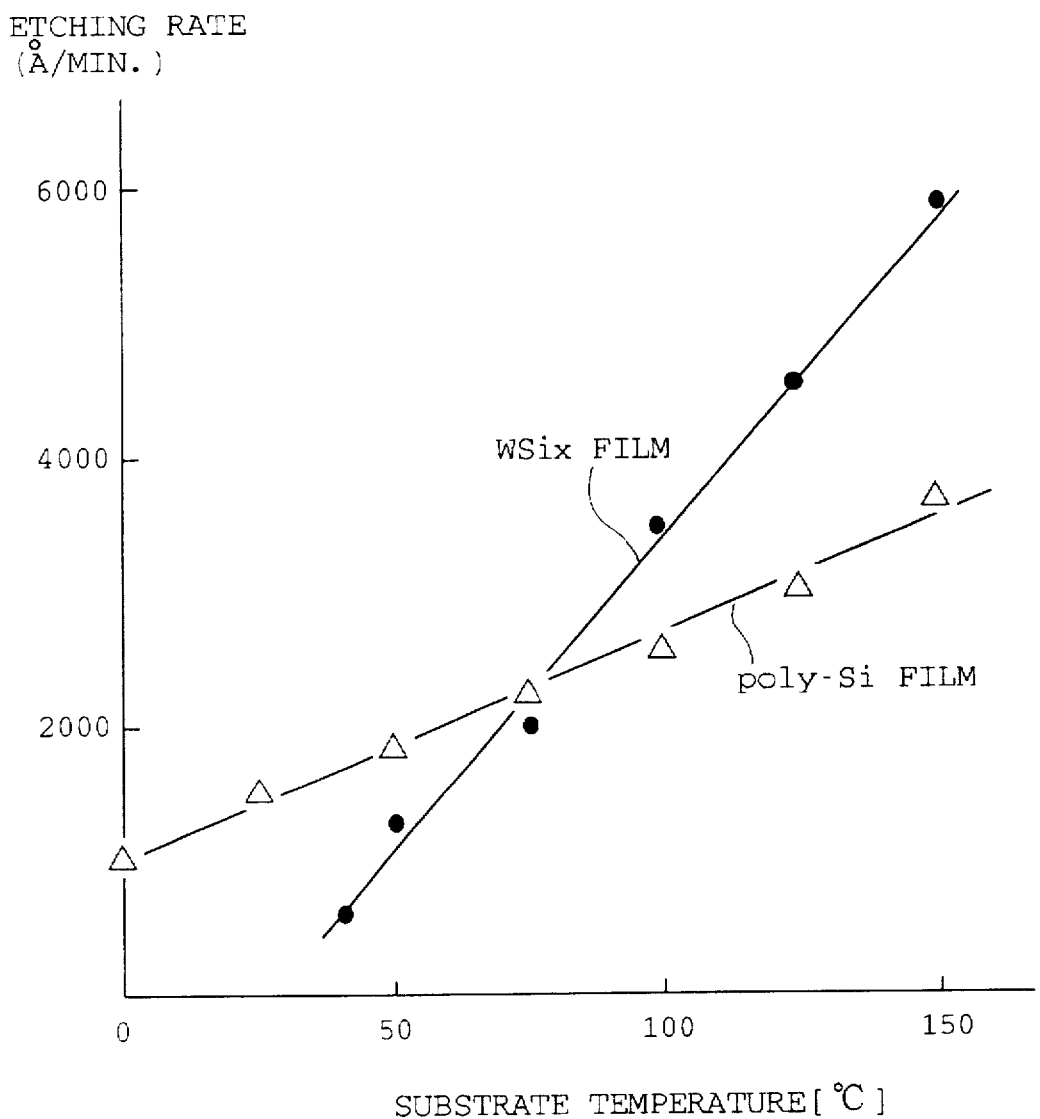
FIG. 8 is a characteristic diagram for explaining the etching rate of a silicon oxide film to the area percentage of the silicon oxide film on the object to be etched when a polysilicon film and a tungsten silicide film are used as an object to be etched and a silicon oxide film is used as an etching-proof film.

The present inventor has made investigation on the above-described two points as follows. Namely, dry etching was applied to a tungsten silicide film as an object to be etched using a silicon oxide film as the etching-proof film and gas loaded with bromine as the reaction gas in a state that the substrate on which an object to be etched was formed was maintained at variety of temperatures. Then, first, the taper angle was investigated in order to evaluate the configuration after etching of the object to be etched. According to the result of investigation, it has been ascertained that a taper angle θ can be maintained at approximately 90 degrees without depending on the substrate temperature within a temperature range of the substrate temperature of approximately 25° C. or higher which is the range for investigation. Secondly, the etching rate of the tungsten silicide film was investigated. According to the result of investigation, it has been ascertained that it is desirable to maintain the substrate temperature at 60° C. or higher in order to obtain a practical etching rate of the tungsten silicide film as shown in FIG. 8.

Taking the foregoing into consideration, it is desirable to maintain the substrate temperature at 60° C. or higher in the etching of a double-layer film composed of a polycrystal silicon film and a tungsten silicide film as an object to be etched in which a silicon oxide film is used as an etching-proof film.

It has been confirmed from the above-described experiment made while taking the result of investigation with respect to the substrate temperature into consideration that a protecting film composed of an easily removable reaction product is formed on the side wall of the object to be etched, thus making it possible to prevent lateral etching of the object to be etched.

In addition, it has been ascertained from another result of investigation made by the present inventor that the etching rate of the silicon oxide film changes by the area ratio on the wafer of the area of the region where the silicon oxide film is formed to the area of the region where the silicon oxide film is not formed and depending on whether the substrate is a polycrystal silicon film or a tungsten silicide film. This means that the silicon oxide film as an etching-proof film which should not be etched is also subjected to etching collaterally during the etching of the polycrystal silicon film and the tungsten silicide film to be etched. Accordingly, it is required to determine the film thickness of the silicon oxide film so that the silicon oxide film as the etching-proof film remains sufficiently after etching of these films taking respective film thickness of the polycrystal silicon film and the tungsten silicide film to be etched into consideration.

The details of embodiments of the present invention executed based on the results of these experiments will be described hereinafter.

(II) Embodiments of the present invention

Figure 6:
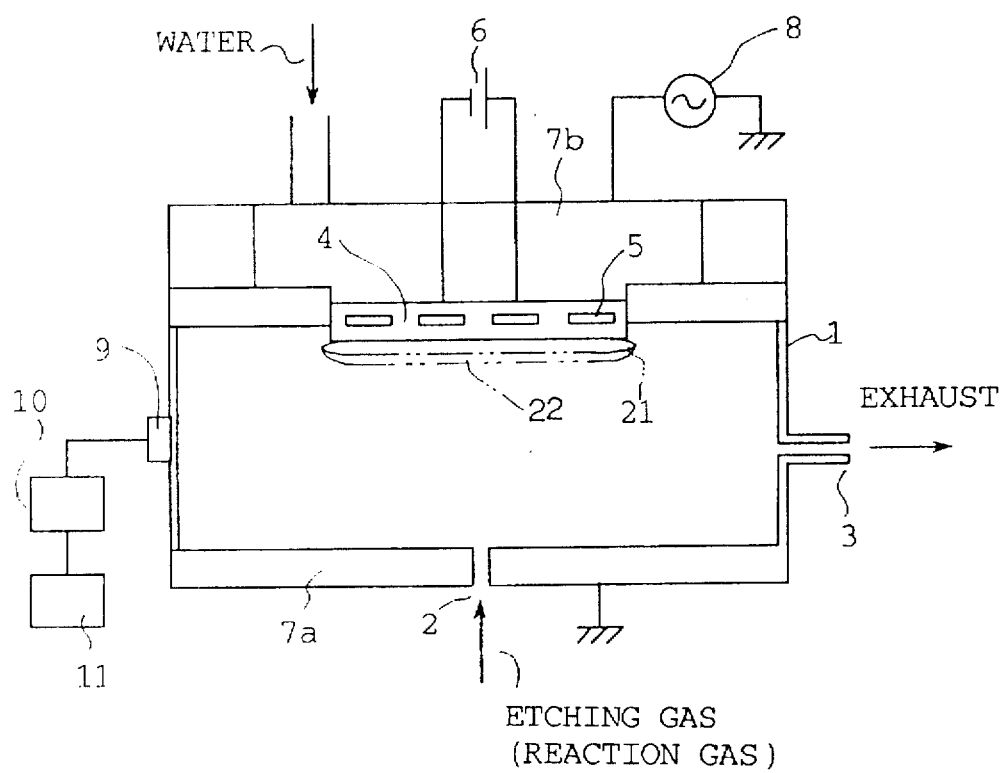
FIG. 6 is a block diagram for explaining a parallel plane type RIE apparatus according to an embodiment of the present invention.

First, FIG. 6 is a block diagram for explaining a parallel plate type reactive ion ether (RIE) apparatus applied to an etching process in the embodiments of the present invention.

In FIG. 6, a reference numeral 1 represents a chamber, 2 represents a gas inlet port for introducing etching gas into the chamber 1, 3 represents an exhaust port of gas after processing, and 4 represents a mounting table provided with electrostatic chucks 5. A D.C. power source 6 is connected to the electrostatic chucks 5, which fix a base substance 21 to the mounting table 4 electrostatically. Further, although it is not illustrated, et heater for heating the object to be etched 22 is provided. 7a and 7b represent an upper plate provided opposedly to the object to be etched 22 and a lower plate coming into contact with the object to be etched 22, respectively, and the upper plate 7a is connected to ground and the lower plate 7b is connected to an R.F. power source 8. 9 represents a quartz window formed on the wall of the chamber 1, and an endpoint detector 10 and a recorder 11 are provided at the quartz window 9 so that the endpoint of etching may be detected and recorded by the color of plasma.

Next, an etching process of an embodiment of the present invention using such an RIE apparatus will be described. Namely, a process of dry etching of the object to be etched 22 of a metal policide film composed of a polycrystal silicon film and a metal silicide film formed on a base substance 21 composed of a silicon substrate and a silicon oxide film using a film composed of an inorganic compound or an etching-proof mask 23 composed of an SOG film containing very little carbon will be described. (A) A case that a film composed of an inorganic compound or an SOG film is used as the etching-proof mask 23 and gas loaded with at least any one of HBr gas, $Br_2$ gas and $BBr_3$ gas is used as the reaction gas will be described.

(1) The first to the seventh embodiments

In the first to the seventh embodiments, a metal polycide film as an object to be etched 36 is etched under such etching conditions that HBr gas is used as the etching gas (reaction gas), the gas flow rate is set to 100 SCCM, the pressure in the chamber is set to 0.13 Torr, the RF power is set to 500 W, and the temperature of the base substance 21 (substrate temperature) is set to 80° C. Besides, the reason why the temperature of the base substance 21 is set to 80° C. is that the etching rate of the metal polycide film is to be maintained at a value required practically and the taper angle θ of the polysilicon film and the metal polycide film after etching is to be maintained at approximately 90° as shown in FIG. 8. These conditions are applied similarly to all the embodiments described hereinafter.

In the first to the seventh embodiments, the combination of the object to be etched and the etching-proof mask is different.

① The First Embodiment

FIG. 2A to FIG. 2D are sectional views for explaining a first embodiment.

Figure 1A:
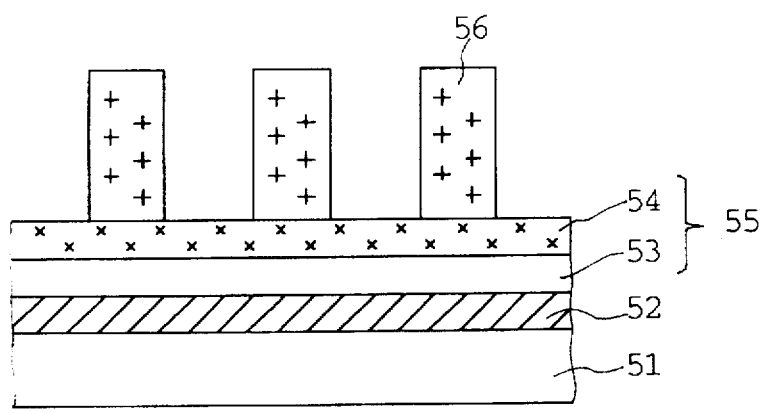
FIG. 1A and FIG. 1B are sectional views for explaining an etching process according to a related art
Figure 1B:
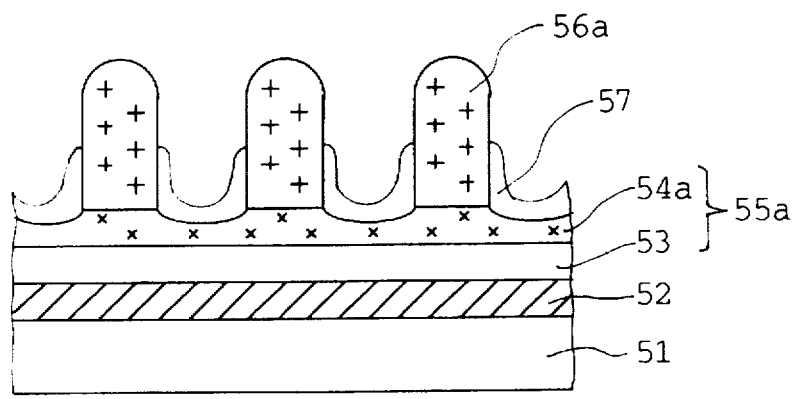
Figure 2A:
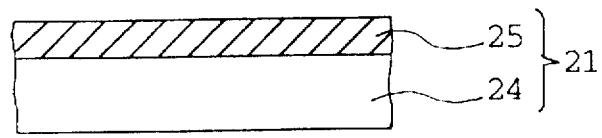
FIG. 2A to FIG. 2D are sectional views for explaining etching processes in a first or an eighth to a 23rd embodiments of the present invention.

FIG. 2A shows a state after a silicon oxide film is formed on a silicon substrate (a semiconductor substrate) 24 by thermal oxidation, and these constitute a base substance 21.

Figure 2B:
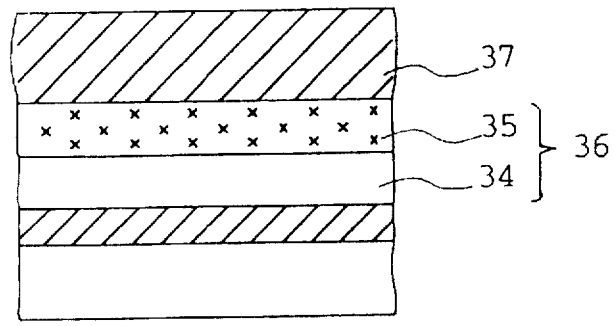
Figure 9:
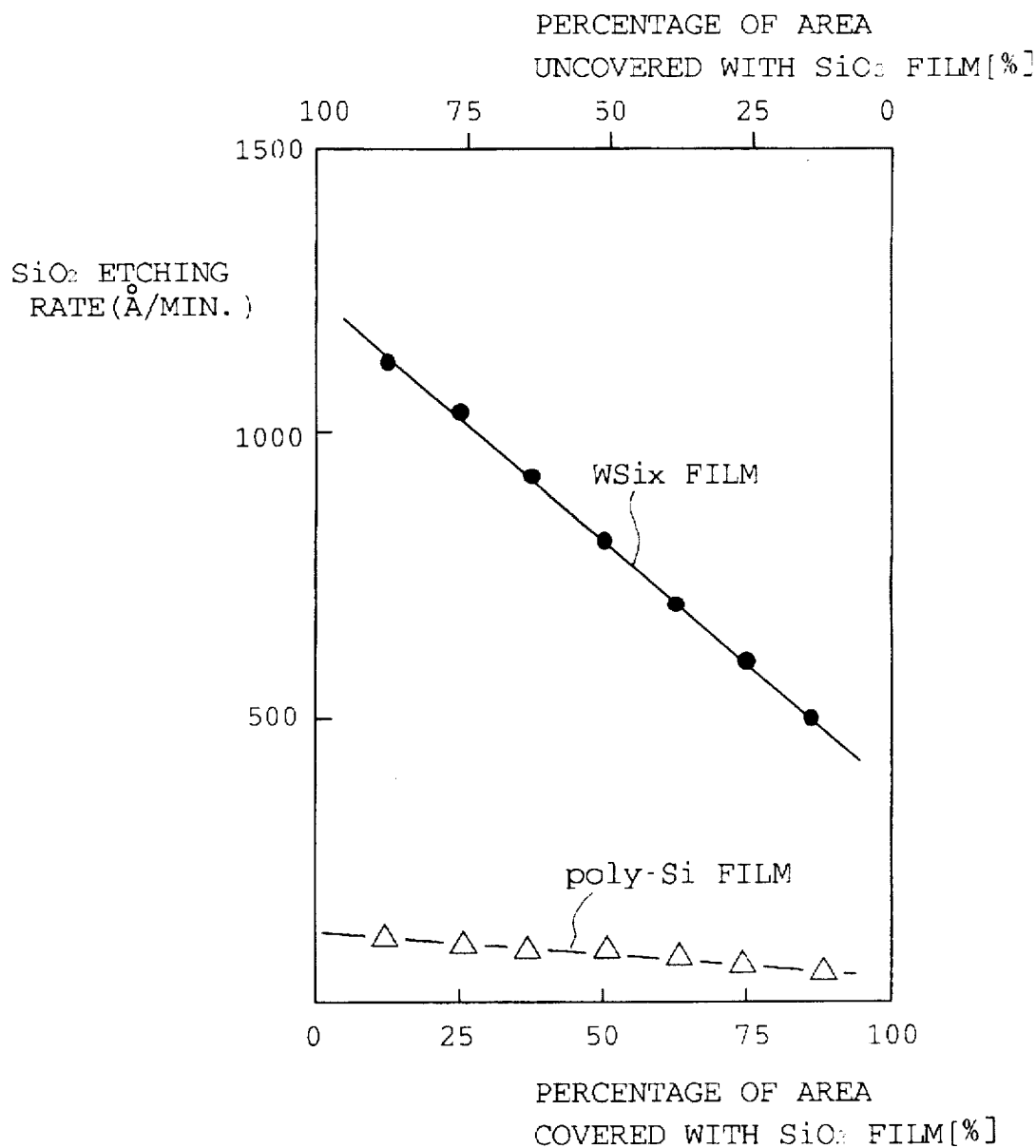
FIG. 9 is a characteristic diagram for explaining etching rates of a polysilicon film and a tungsten silicide film versus the substrate temperature when a polysilicon film and a tungsten silicide film are used as an object to be etched and a silicon oxide film is used as an etching-proof film.

In such a state, a polysilicon film 34 having a film thickness of 2,000 Å and a tungsten silicide film (a metal silicide film) 35 having a film thickness of approximately 2,000 Å are formed first on the silicon oxide film 25 in consecutive order by a CVD method as shown in FIG. 2B. This double-layer film becomes the object to be etched 36. Besides, such a double-layer film is generally referred to as a tungsten polycide film (a metal polycide film) 36. Then, a silicon oxide film 37 having a film thickness of approximately 2,000 Å which becomes an etching-proof mask is formed on the tungsten silicide film 35 by a CVD method. Besides, it is shown from the results of experiments made by the present inventor shown in FIG. 9 that it is required to form the silicon oxide film 37 having a sufficient film thickness so that the silicon oxide film 37 as an etching-proof film can stand etching sufficiently taking respective film thickness of the polycrystal silicon film 34 and the tungsten silicide film 35 to be etched into consideration.

Figure 2C:
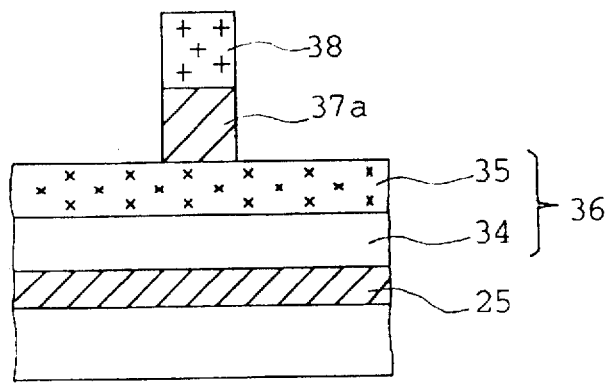

Next, the silicon oxide film 37 is removed by etching selectively with a selectively formed photoresist film 38 as a mask by reactive ion etching (RIE) using a $CF_4/CHF_3$ gas mixture so as to form an etching-proof mask 37a composed of remaining silicon oxide film as shown in FIG. 2C.

Then, the object to be etched 36 is etched selectively based on the etching-proof mask 37a after removing the photoresist film 38. The details of the operation will be described hereunder.

First, the base substance 21 on which the tungsten silicide film 22 is formed is mounted on the mounting table 4, and D.C. voltage is applied to the electrostatic chucks 5 by the D.C. power source 6 so as to fix the base substance 21 electrostatically.

Next, the inside of the chamber 1 is exhausted through the exhaust port 3 so as to reduce the pressure therein.

Then, the base substance 21 is heated by feeding hot water into the mounting table 4 so as to maintain the temperature of the base substance 21 at 80° C.

Further, when the internal pressure of the chamber 1 reaches to a predetermined value, the HBr gas is introduced at a gas flow rate of 100 SCCM as reaction gas through the gas inlet port 2, and the exhaust quantity is regulated so as to maintain the pressure in the chamber 1 at 0.05 Torr.

Figure 2D:
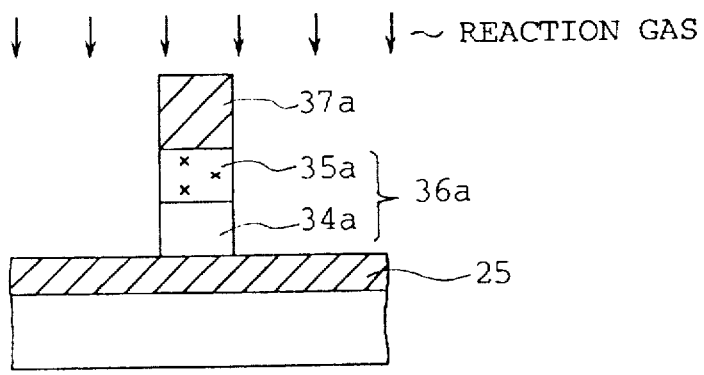

Then, RF power of 500 W is applied between the upper plate 7a and the lower plate 7b by means of an R.F. power source 8. With this, the reaction gas is formed into plasma and acts on the tungsten silicide film 22, and the tungsten silicide film 22 is etched based on the etching-proof mask 23a. At this time, the etching rate of 2,000 Å/min. for a tungsten silicide film 35, the etching rate of 2,380 Å/min. for a polysilicon film 34, and the selectivity of 19 for the polysilicon film 34 to a substrate silicon oxide film 25 were obtained, respectively. An almost perpendicular sectional configuration was obtained as shown in FIG. 2D for the sectional configuration after etching of an object to be etched 36a. Further, the uniformity of the etching rate was ±10% or less.

② The Second Embodiment

Figure 3A:
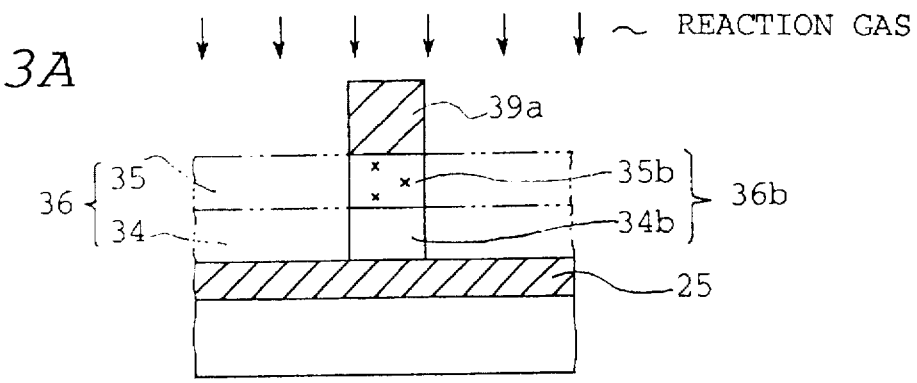
FIG. 3A to FIG. 3C are sectional views for explaining etching processes in a second to a fourth embodiments of the present invention.

FIG. 3A is a sectional view for explaining a second embodiment, and shows a state after etching the, object to be etched 36 based on an etching-proof mask 39a. What differs from the first embodiment is the fact that a silicon nitride film having a film thickness of approximately 2,000 Å is used as an etching-proof mask 39a. This etching-proof mask 39a was formed through removal by selective etching with a photoresist film not shown as a mask by means of reactive ion etching using a $CF_4/CHF_3$ gas mixture after being formed on the object to be etched 36. Besides, the object to be etched 36 was composed of a double-layer film of a polysilicon film 34 having a film thickness of approximately 2,000 Å and a tungsten silicide film (a metal silicide film) 35 having a film thickness of approximately 2,000 Å, and was formed successively by a CVD method.

Next, the object to be etched 36 is etched selectively in accordance with the etching-proof mask 39a after removing a photoresist film not shown, but the process is similar to that in the first embodiment. Hence, the description thereof is omitted.

With this, the etching rate of 1,750 Å/min. for a molybdenum silicide film 40, the etching rate of 2,250 Å/min. for a polysilicon film 34, and the selectivity of 18 for the polysilicon film to a substrate silicon oxide film 25 were obtained, respectively. An almost perpendicular sectional configuration was obtained as shown in FIG. 3A for the sectional configuration after etching of an object to be etched 36b.

③ The Third Embodiment

Figure 3B:
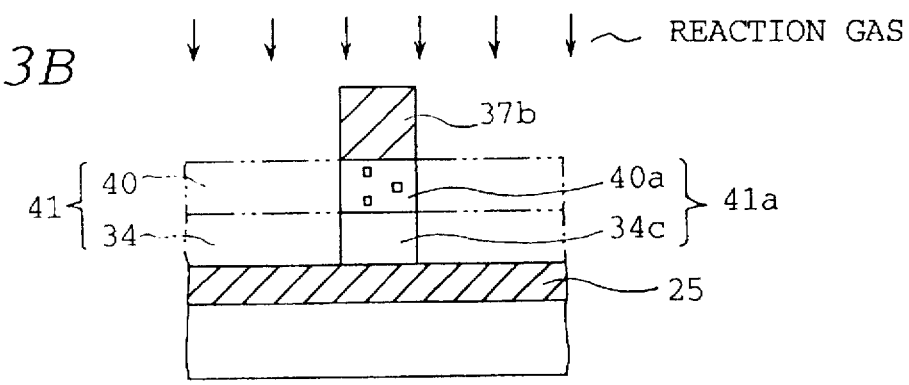

FIG. 3B is a sectional view for explaining a third embodiment, and shows a state after the object to be etched is etched in accordance with an etching-proof mask. What differs from the second embodiment is the fact that a silicon oxide film having a film thickness of approximately 2,000 Å is used as an etching-proof mask 37b, and a molybdenum polycide film (a metal polycide film) composed of a polysilicon film 34 having a film thickness of approximately 2,000 Å and a molybdenum silicide film (a metal silicide film) 40 having a film thickness of approximately 2,000 Å is used as an object to be etched 41.

By applying etching conditions and process similar to those in the first embodiment to such a sample, the etching rate of 1,750 Å/min. for a molybdenum silicide film 40, the etching rate of 2,250 Å/min. for a polysilicon film 34, and the selectivity of 18 for the polysilicon film to a substrate silicon oxide film 25 were obtained, respectively. An almost perpendicular sectional configuration was obtained as shown in FIG. 3B for the sectional configuration after etching of an object to be etched 41a.

④ The Fourth Embodiment

Figure 3C:
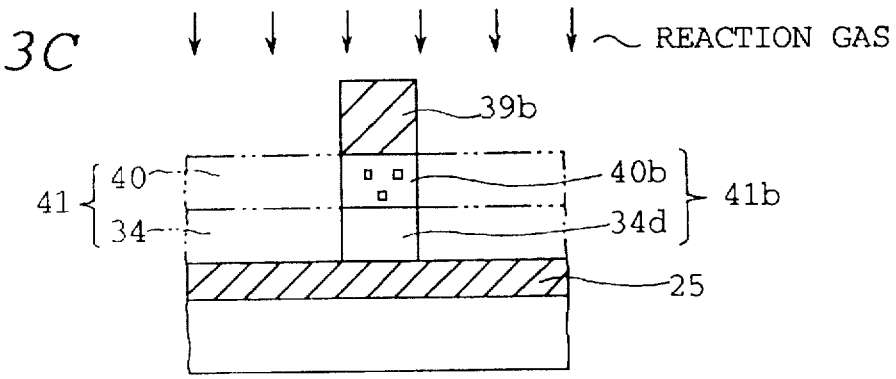

FIG. 3C is a sectional view for explaining a fourth embodiment, and shows a state after an object to be etched is etched based on an etching-proof mask. What differs from the third embodiment is the fact that a silicon nitride film having a film thickness of approximately 2,000 Å is used as an etching-proof mask 39b.

In this case, by applying an etching process similar to that in the first embodiment, the etching rate of 1,500 Å/min. for a molybdenum silicide film 40, the etching rate of 2,000 Å/min. for a polysilicon film, and the selectivity of 16 for the polysilicon film to a substrate silicon oxide film were obtained, respectively.

An almost perpendicular sectional configuration was obtained as shown in FIG. 3C for the sectional configuration after etching of an object to be etched 41b.

⑤ The Fifth Embodiment

Figure 4A:
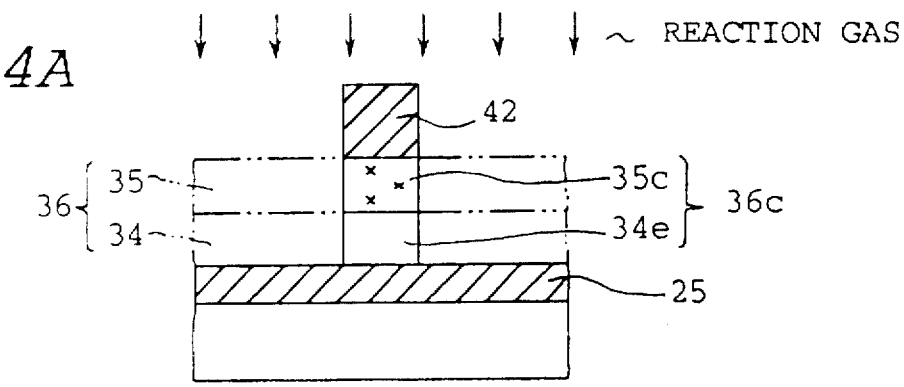
FIG. 4A to FIG. 4C are sectional views for explaining etching processes in a fifth to a seventh embodiments of the present invention.

FIG. 4A is a sectional view for explaining a fifth embodiment, and shows a state after etching an object to be etched based on an etching-proof mask. What differs from the first and the second embodiments is the fact that phosphorus glass (a PSG film) having a film thickness of approximately 2,000 Å is used as an etching-proof mask 42.

In this case, by applying an etching process similar to that in the first embodiment, the etching rate of 2,000 Å/min. for a tungsten silicide film 35, the etching rate of 2,380 Å/min. for the polysilicon film 34, and the selectivity of 19 for the polysilicon film 34 to a substrate silicon oxide film 25 were obtained, respectively. An almost perpendicular sectional configuration was obtained as shown in FIG. 4A for the sectional configuration after etching of an object to be etched 36c.

⑥ The Sixth Embodiment

Figure 4B:
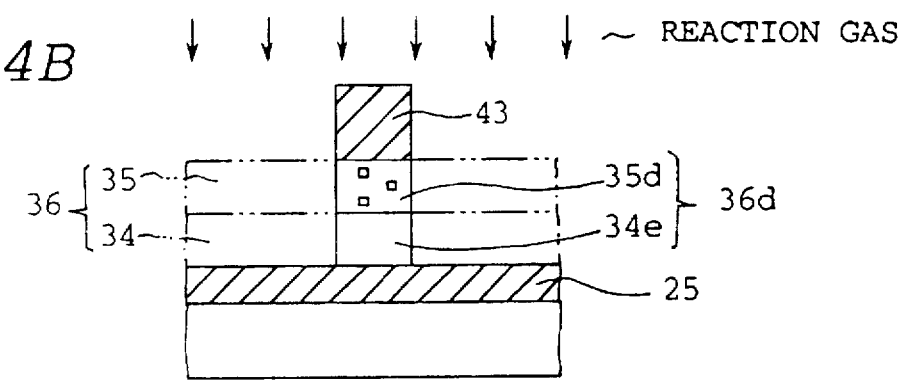

FIG. 4B is a sectional view for explaining a sixth embodiment, and shows a state after etching an object to be etched based on an etching-proof mask. What differs from the fifth embodiment is the fact that boron-phosphorus glass (BPSG) film having a film thickness of approximately 2,000 Å is used as an etching-proof mask 43.

In this case, by applying an etching process similar to that in the first embodiment, the etching rate of 2,000 Å/min. for a tungsten silicide film 35, the etching rate of 2,380 Å/min. for the polysilicon film 34, and the selectivity of 19 for the polysilicon film 34 to a substrate silicon oxide film 25 were obtained, respectively. An almost perpendicular sectional configuration was obtained as shown in FIG. 4B for the sectional configuration after etching of an object to be etched 36d.

⑦ The Seventh Embodiment

Figure 4C:
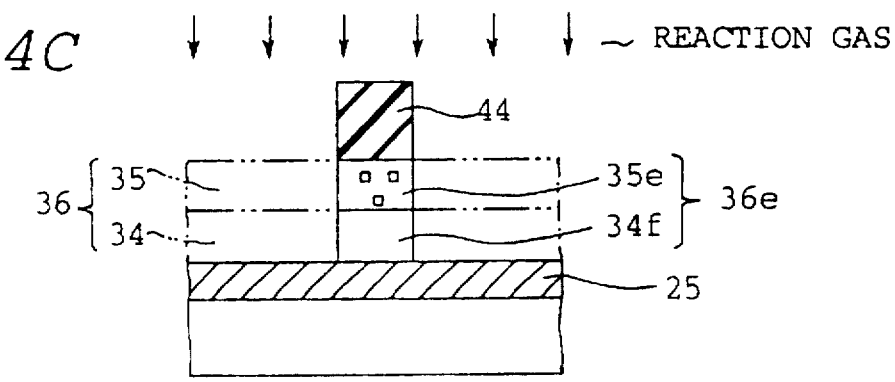
Figure 5:
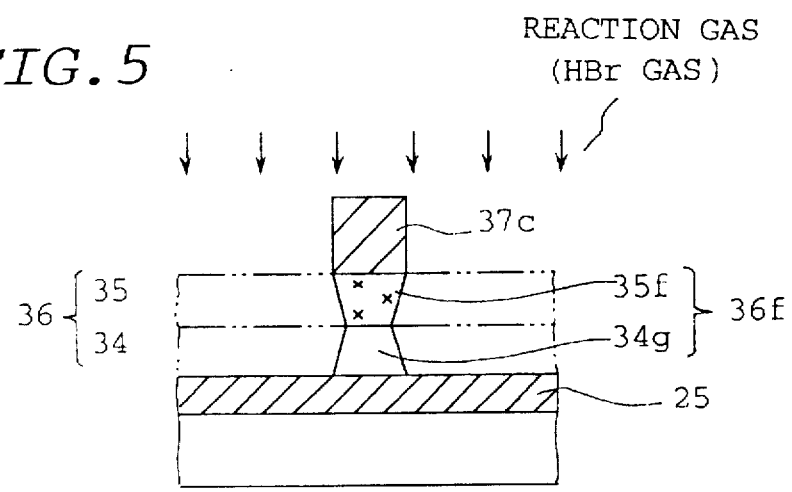
FIG. 5 is a sectional view for explaining a comparison example with a tenth and an 11th embodiments; of the present invention.

FIG. 4C is a sectional view for explaining an seventh embodiment, and shows a state after etching an object to be etched based on an etching-proof mask. What differs from the fifth and the sixth embodiments is the fact that a spin on glass (SOG) film having a film thickness of approximately 2,000 Å is used as an etching-proof mask 44.

In this case, by applying an etching process similar to that in the first embodiment, the etching rate of 1,980 Å/min. for a tungsten silicide film 35, the etching rate of 2,380 Å/min. for the polysilicon film 34, and the selectivity of 19 for the polysilicon film 34 to a substrate silicon oxide film 25 were obtained, respectively. An almost perpendicular sectional configuration, was obtained as shown in FIG. 4C for the sectional configuration after etching of an object to be etched 36e.

As described above, according to the first to the seventh embodiments of the present invention, since a film composed of an inorganic compound or an SOG film producing very little blowout of carbon when exposed to plasma is used for etching-proof masks 37a, 39a, 37b, 39b and 42 to 44, it is possible to protect the side wall appropriately by forming a protecting film which is composed of a reaction product loaded with no carbon but loaded with bromine through plasma etching processing using HBr gas as the etching gas. With this, it becomes possible to etch metal polycide films 36a to 36e, 41a and 41b having higher dimensional controllability.

Further, the etching rate of the substrate silicon oxide film 25 was lowered since the film is free of carbon or only a very small amount of carbon is blown out. On the other hand, the etching rate of the polysilicon film 34 was not lowered relatively to the above. As a result, the selectivity of etching between the polysilicon film and the substrate silicon oxide film 25 was increased.

(2) The eighth Embodiment

In an eighth embodiment, what differs from the first to the seventh embodiments is the fact that $Br_2$ gas is used as the etching gas (reaction gas). Similarly to the first to the seventh embodiments, the etching conditions are such that the gas flow rate is set to 100 SCCM, the pressure in the chamber is set to 0.13 Torr, the RF power is set to 500 W, and the substrate temperature is set to 80° C.

A sample similar to that used in the first embodiment shown in FIG. 2C is used. Therefore, such a sample is also used. FIG. 2C is a sectional view showing a state prior to etching after an etching-proof mask 37a is formed, in which a silicon oxide film having a film thickness of approximately 2,000 Å is used as the etching-proof mask 37a, and a polysilicon film 34 having a film thickness of approximately 2,000 Å and a tungsten silicide film (a metal polycide film) 35 having a film thickness of approximately 2,000 Å are used as an object to be etched 36.

In this case, by applying an etching process similar to that in the first embodiment, the etching rate of 1,980 Å/min. for a tungsten silicide film 35, the etching rate of 2,200 Å/min. for the polysilicon film 34, and the selectivity of 19 for the polysilicon film 34 to a substrate silicon oxide film 25 were obtained, respectively. An almost perpendicular sectional configuration was obtained as shown in FIG. 2D for the sectional configuration after etching of an object to be etched 36a.

(3) The Ninth Embodiment

In a ninth embodiment, what differs from the eighth embodiment is the fact that a $HBr/Br_2$ gas mixture is used as the etching gas (reaction gas), the flow rate of HBr gas is set to 50 SCCM and the flow rate of $Br_2$ gas is set to 50 SCCM, and other etching conditions are set; similar to those in the eighth embodiment. Namely, the pressure in the chamber is set to 0.13 Torr, the RF power is set to 500 W, and the substrate temperature is set to 80° C.

Further, a sample used in the eighth embodiment; similar to that in the first embodiment shown in FIG. 2C is used.

In this case, by applying an etching process similar to that in the first embodiment, the etching rate of 1,980 Å/min. for a tungsten silicide film 35, the etching rate of 2,200 Å/min. for the polysilicon film 34, and the selectivity of 19 for the polysilicon film 34 to a substrate silicon oxide film 25 were obtained, respectively. An almost perpendicular sectional configuration was obtained as shown in FIG. 2D for the sectional configuration after etching of an object to be etched 36a.

According to the eighth and ninth embodiments described above, it is possible to apply dry etching to a metal silicide film such as a tungsten silicide film 35 by various bromine gas and to secure high dimensional controllability.

(4) The Tenth and 11th Embodiments and Comparison Example

In a tenth and an 11th embodiments, a silicon oxide film having a film thickness of approximately 2,000 Å is used as an etching-proof mask 37a and a base substance 21 on which a polysilicon film 34 having a film thickness of approximately 2,000 Å and a tungsten silicide film (a metal polycide film) 35 having a film thickness of approximately 2,000 Å are formed is used as an object to be etched 36. What differs from the above-described first embodiment is the fact that gas obtained by mixing rare gas with HBr gas is used as etching gas, and the pressure in the chamber is increased to 0.5 Torr ① The Tenth Embodiment The tenth embodiment will be described with reference to FIG. 2C and FIG. 2D. An HBr/He gas mixture is used as etching gas (reaction gas), in which the flow rate of HBr gas is set to 100 SCCM and the flow rate of He gas is set to 20 SCCM. In this case, by applying an etching process similar to that in the first embodiment, the etching rate of 1,200 Å/min. for a tungsten silicide film 35, the etching rate of 1,800 Å/min. for the polysilicon film 34, and the selectivity of 35 for the polysilicon film 34 to a substrate silicon oxide film 25 were obtained, respectively. An almost perpendicular sectional configuration was obtained as shown in FIG. 2D for the sectional configuration after etching of an object to be etched 36a. Further, the uniformity of the etching rate was ±10% or less on the wafer.

② The 11th Embodiment

The 11th embodiment will be described with reference to FIG. 2C and FIG. 2D. An HBr/Ar gas mixture is used as etching gas (reaction gas), in which the flow rate of HBr gas is set to 100 SCCM and the flow rate of Ar gas is set to 20 SCCM. In this case, by applying an etching process similar to that in the first embodiment, the etching rate of 1,000 Å/min. for a tungsten silicide film 35, the etching rate of 1,600 Å/min. for the polysilicon film 34, and the selectivity of 30 for the polysilicon film 34 to a substrate silicon oxide film 25 were obtained, respectively. An almost perpendicular sectional configuration was obtained as shown in FIG. 2D for the sectional configuration after etching of an object to be etched 36a. Further, the uniformity of the etching rate was ±10% or less on the wafer.

③ Comparison Example

A comparison example will be described with reference to FIG. 4. A sample similar to that in FIG. 2C: is used, HBr gas mixed with no rare gas is used as the etching gas, the flow rate of HBr gas is set to 50 SCCM, and pressure in the chamber is increased to as high as 0.5 Torr. In this case, by applying an etching process similar to that in the first embodiment, the etching rate of 200 Å/min. for a tungsten silicide film 35, the etching rate of 1,000 Å/min. for a polysilicon film 34, and the selectivity of 40 for the polysilicon film 34 to a substrate silicon oxide film 25 were obtained, respectively. Lateral etching is produced both in a tungsten silicide film 35f and a polysilicon film 34g in a sectional configuration after etching of an object to be etched 36f as shown in FIG. 4, which is not so preferable. Moreover, the uniformity of the etching rate exceeds ±30% on the wafer, and has been degraded remarkably as compared with the results obtained in the first, the tenth and the 11th embodiments.

As described above, in the tenth and the 11th embodiments, it has become possible to generate plasma more easily even if the pressure of HBr gas is increased as compared with a case of bromine gas only by using a gas mixture obtained by adding rare gas to gas loaded with, bromine. With this, it has become possible to aim at improvement of the selectivity by high pressure of HBr gas while increasing the uniformity of etching in the wafer by means of unification of plasma generation.

(B) A case in which an inorganic compound or an SOG film is used as an etching-proof mask and a gas mixture obtained by adding at least one of rare gas, gas loaded with oxygen gas, gas loaded with nitrogen or gas loaded with hydrogen to gas containing at least any one of HBr gas, $Br_2$ gas and $BBr_3$ gas is used as reaction gas will be described.

(5) The 12th and the 13th Embodiments

In a 12th and a 13th embodiments, similarly to the first embodiment shown in FIG. 2C, a silicon oxide film having a film thickness of approximately 2,000 Å is used as an etching-proof film 37a and a base substance 21 on which a polysilicon film 34 having a film thickness of approximately 2,000 Å and a tungsten silicide film (a metal polycide film) 35 having a film thickness of approximately 2,000 Å are formed is used as an object to be etched 36. Further, what differs from the first embodiment is the fact that gas obtained by adding oxygen gas to bromine gas is used as reaction gas.

① The 12th Embodiment

A 12th embodiment will be described with reference to FIG. 2C and FIG. 2D. A $HBr/O_2$ gas mixture is used as the etching gas (reaction gas), the flow rate of HBr gas is set to 100 SCCM and the flow rate of $O_2$ gas is set to 2 SCCM. In this case, by applying an etching process similar to that in the first embodiment, the etching rate of 2,100 Å/min. for a tungsten silicide film 35, the etching rate of 2,200 Å/min. for a polysilicon film 34, and the selectivity of 25 for the polysilicon film 34 to a substrate silicon oxide film 25 were obtained, respectively. Further, an almost perpendicular sectional configuration was obtained as shown in FIG. 2D for the sectional configuration after etching of an object to be etched 36a.

② The 13th Embodiment

A 13th embodiment will be described with reference to FIG. 2C and FIG. 2D. What differs from the 12th embodiment is the fact that a $HBr/O_3$ gas mixture is used as the etching gas (reaction gas), the flow rate of HBr gas is set to 100 SCCM and the flow rate of $O_3$ gas is set to 2 SCCM. In this case, by applying an etching process similar to that in the first embodiment, the etching rate of 2,100 Å/min. for a tungsten silicide film 35, the etching rate of 2,200 Å/min. for a polysilicon film 34, and the selectivity of 25 for the polysilicon film 34 to a substrate silicon oxide film 25 were obtained, respectively. Further, an almost perpendicular sectional configuration was obtained as shown in FIG. 2D for the sectional configuration after etching of an object to be etched 36a.

In the 12th and 13th embodiments, the selectivity of the polysilicon film 34 to an etching-proof mask 37a and to a substrate silicon oxide film 25 was improved as compared with the case of the first embodiment by adding oxygen gas to bromine gas. Besides, it is desirable that the oxygen gas does not contain carbon and fluorine.

Further, since no photoresist film is used as the etching-proof mask 37a, it has become possible to prevent formation of a reaction product which is difficult to be removed for a double-layer film composed of a polysilicon film and a metal silicide film in a similar manner as the first embodiment, and to secure higher dimensional controllability. Furthermore, such a harmful influence that the configuration of an object to be etched 36 after etching depends on pattern dimensions of an etching-proof mask and the exposed area of the object to be etched 36 when a photoresist film is used as an etching-proof mask has also been decreased.

(6) The 14th and the 15th Embodiments

In a 14th and a 15th embodiments, similarly to the first embodiment shown in FIG. 2C, a silicon oxide film having a film thickness of approximately 2,000 Å is used as an etching-proof film 37a and a base substance 21 on which a polysilicon film 34 having a film thickness of approximately 2,000 Å and a tungsten silicide film (a metal polycide film) 35 having a film thickness of approximately 2,000 Å are formed is used as an object to be etched 36. Further, what differs from the first; embodiment is the fact that gas obtained by adding nitrogen gas to bromine gas is used as reaction gas.

① The 14th Embodiment

A 14th embodiment will be described with reference to FIG. 2C and FIG. 2D. A $HBr/N_2$ gas mixture is used as the etching gas (reaction gas), the flow rate of HBr gas is set to 100 SCCM and the flow rate of $N_2$ gas is set to 10 SCCM. In this case, by applying an etching process similar to that in the first embodiment, the etching rate of 1,780 Å/min. for a tungsten silicide film 35, the etching rate of 2,000 Å/min. for a polysilicon film 34, and the selectivity of 24 for the polysilicon film 34 to a substrate silicon oxide film 25 were obtained, respectively. An almost perpendicular sectional configuration was obtained as shown in FIG. 2D for the sectional configuration after etching of an object to be etched 36a. Besides, in case of a silicon nitride film is used as a substrate insulating film, the selectivity of the polysilicon film to a substrate silicon nitride film becomes 8, which is substantially low.

②  The 15th Embodiment

A 15th embodiment will be described with reference to FIG. 2C and FIG. 2D. What differs from the 14th embodiment is the fact that a $HBr/NH_3$ gas mixture is used as the etching gas (reaction gas), the flow rate of HBr gas is set to 100 SCCM and the flow rate of $NH_3$ gas is set to 10 SCCM. In this case, by applying an etching process similar to that in the first embodiment, the etching rate of 1,780 Å/min. for a tungsten silicide film 35, the etching rate of 2,000 Å/min. for a polysilicon film 34, and the selectivity of 24 for the polysilicon film 34 to a substrate silicon oxide film 25 were obtained, respectively. Further, an almost perpendicular sectional configuration was obtained as shown in FIG. 2D for the sectional configuration after etching of an object to be etched 36a.

Besides, in the case of the 15th embodiment, the selectivity of the polysilicon film to a substrate silicon nitride film also becomes 8, which is substantially low, when a silicon nitride film is used as a substrate insulating film similarly to the case of the 14th embodiment.

In the 14th and the 15th embodiments, the selectivity of the polysilicon film 34 to the etching-proof mask 37a and the substrate silicon oxide film 25 has been improved as compared with the case of the first embodiment by adding nitrogen gas to bromine gas. Besides, it is desirable that nitrogen gas does not contain carbon and fluorine.

Further, since no photoresist film was used as the etching-proof mask 37a, it was possible to prevent formation of a reaction product which is hard to be removed on a double-layer film composed of a polysilicon film and a metal silicide film similarly to the first embodiment, and to secure higher dimensional controllability. Furthermore, such a harmful influence that the configuration after etching of an object to be etched 36 depends on pattern dimensions of an etching-proof mask and the exposed area of the object to be etched 36 when a photoresist film is used as an etching-proof mask has also been decreased.

(7) The 16th and the 17th Embodiments

In a 16th and a 17th embodiments, similarly to the first embodiment shown in FIG. 2C, a silicon oxide film having a film thickness of approximately 2,000 Å is used as an etching-proof film 37a and a base substance 21 on which a polysilicon film 34 having a film thickness of approximately 2,000 Å and a tungsten silicide film (a metal polycide film) 35 having a film thickness of approximately 2,000 Å are formed is used as an object to be etched 36. Further, what differs from the first embodiment is the fact that gas obtained by adding hydrogen gas to bromine gas is used as reaction gas.

① The 16th Embodiment

A 16th embodiment will be described with reference to FIG. 2C and FIG. 2D. A $HBr/H_2$ gas mixture is used as the etching gas (reaction gas), the flow rate of HBr gas is set to 100 SCCM and the flow rate of $H_2$ gas is set to 5 SCCM. In this case, by applying an etching process similar to that in the first embodiment, the etching rate of 2,000 Å/min. for a tungsten silicide film 35, the etching rate of 2,380 Å/min. for a polysilicon film 34, and the selectivity of 20 for the polysilicon film 34 to a substrate silicon oxide film 25 were obtained, respectively. An almost perpendicular sectional configuration was obtained as shown in FIG. 2D for the sectional configuration after etching of an object to be etched 36a.

② The 17th Embodiment

A 17th embodiment will be described with reference to FIG. 2C and FIG. 2D. What differs from the 16th embodiment is the fact that a $HBr/H_2S$ gas mixture is used as the etching gas (reaction gas), the flow rate of HBr gas is set to 100 SCCM and the flow rate of $H_2S$ gas is set to 5 SCCM. In this case, by applying an etching process similar to that in the first embodiment, the etching rate of 2,000 Å/min. for a tungsten silicide film 35, the etching rate of 2,380 Å/min. for a polysilicon film 34, and the selectivity of 20 for the polysilicon film 34 to a substrate silicon oxide film 25 were obtained, respectively. Further, an almost perpendicular sectional configuration was obtained as shown in FIG. 2D for the sectional configuration after etching of an object to be etched 36a.

In the 16th and the 17th embodiments, the selectivity of the polysilicon film 34 to the etching-proof mask 37a and the substrate silicon oxide film 25 has been improved as compared with the case of the first embodiment by adding hydrogen gas to bromine gas. Besides, it is desirable that hydrogen gas does not contain carbon and fluorine.

Further, since no photoresist film was used as the etching-proof mask 37a, it was possible to prevent formation of a reaction product which is hard to be removed on a double-layer film composed of a polysilicon film and a metal silicide film similarly to the first embodiment, and to secure higher dimensional controllability. Furthermore, such a harmful influence that the configuration after etching of an object to be etched 36 depends on pattern dimensions of an etching-proof mask and the exposed area of the object to be etched 36 when a photoresist film is used as an etching-proof mask has also been decreased.

(8) The 18th and the 19th Embodiments

In an 18th and 19th embodiments, a silicon oxide film having a film thickness of approximately 2,000 Å is used as an etching-proof mask 37a and a base substance 21 on which a polysilicon film 34 having a film thickness of approximately 2,000 Å and a tungsten silicide film (metal polycide film) 35 having a film thickness of approximately 2,000 Å are formed is used as an object to be etched 36. Further, what differs from the first embodiment is the fact that bromine gas added with rare gas and oxygen gas is used as the reaction gas, and the pressure in the chamber is set to as high as 0.5 Torr.

① The 18th Embodiment

The 18th embodiment will be described with reference to FIG. 2C and FIG. 2D. A $HBr/He/O_2$ gas mixture is used as etching gas, and the flow rates of HBr gas, He gas and $O_2$ gas are set to 100 SCCM, 20 SCCM and 2 SCCM, respectively. In this case, by applying an etching process similar to that in the first embodiment, the etching rate of 2,000 Å/min. for a tungsten silicide film 35, the etching rate of 2,100 Å/min. for a polysilicon film 34, and the selectivity of 20 for the polysilicon film 34 to a substrate silicon oxide film 25 were obtained, respectively. An almost perpendicular sectional configuration was obtained as shown in FIG. 2D for the sectional configuration of an object to be etched 36a after etching.

② The 19th Embodiment

The 19th embodiment will be described with reference to FIG. 2C and FIG. 2D. What differs from the 18th embodiment is the fact that a HBr/He/O₃ gas mixture is used as etching gas (reaction gas), and the flow rates of HBr gas, He gas and O₃ gas are set to 100 SCCM, 20 SCCM and 2 SCCM, respectively. In this case, by applying an etching process similar to that in the first embodiment, the etching rate of 2,000 Å/min. for a tungsten silicide film 35, the etching rate of 2,100 Å/min. for a polysilicon film 34, and the selectivity of 22 for the polysilicon film 34 to a substrate silicon oxide film 25 were obtained, respectively. An almost perpendicular sectional configuration was obtained as shown in FIG. 2D for the sectional configuration after etching of an object to be etched 36a.

In the 18th and the 19th embodiments, the selectivity of the polysilicon film 34 to a silicon nitride film which is an etching-proof mask 37a and to the substrate silicon oxide film 25 has been improved as compared with the case of the first embodiment by adding rare gas and oxygen gas to bromine gas. Further, it has been confirmed in the tenth and the 11th embodiments that the uniformity of the etching rate and the selectivity of etching are improved by adding rare gas to bromine gas. Furthermore, although the selectivity was lowered as compared with the cases of the tenth and the 11th embodiments by adding oxygen gas, the etching rate of the polysilicon film 34 has been improved. Besides, it is desirable that the oxygen gas does not contain carbon and fluorine.

Further, since no photoresist film is used as the etching-proof mask 37a, it has become possible to prevent formation of a reaction product which is difficult to be removed on a double-layer film composed of a polysilicon film and a metal silicide film, thereby to secure higher dimensional controllability. Moreover, such a harmful influence that the configuration of the object to be etched 36 after etching depends on the pattern dimensions and the exposed area of the object to be etched 36 when a photoresist film is used as an etching-proof mask is also reduced.

(9) The 20th and the 21st Embodiments

In a 20th and a 21st embodiments, a silicon oxide film having a film thickness of approximately 2,000 Å is used as an etching-proof mask 37a and a base substance 21 on which a polysilicon film 34 having a film thickness of approximately 2,000 Å and a tungsten silicide film (a metal polycide film) 35 having a film thickness of approximately 2,000 Å are formed is used as an object to be etched 36. Further, what differs from the first embodiment is the fact that bromine gas added with rare gas and nitrogen gas is used as the reaction gas, and the pressure in the chamber is set to as high as 0.5 Torr.

① The 20th Embodiment

The 20th embodiment will be described with reference to FIG. 2C and FIG. 2D. A HBr/He/N₂ gas mixture is used as etching gas, and the flow rates of HBr gas, He gas and N₂ gas are set to 100 SCCM, 20 SCCM and 10 SCCM, respectively. In this case, by applying an etching process similar to that in the first embodiment, the etching rate of 1,700 Å/min. for a tungsten silicide film 35, the etching rate of 1,900 Å/min. for a polysilicon film 34, and the selectivity of 22 for the polysilicon film 34 to a substrate silicon oxide film 25 were obtained, respectively. An almost perpendicular sectional configuration was obtained as shown in FIG. 2D for the sectional configuration of an object to be etched 36a after etching.

② The 21st Embodiment

The 21st embodiment will be described with reference to FIG. 2C and FIG. 2D. What differs from the 20th embodiment is the fact that a HBr/He/NH₃ gas mixture is used as etching gas (reaction gas), and the flow rates of HBr gas, He gas and NH₃ gas are set to 100 SCCM, 20 SCCM and 10 SCCM, respectively. In this case, by applying an etching process similar to that in the first embodiment, the etching rate of 2,000 Å/min. for a tungsten silicide film 35, the etching rate of 2,100 Å/min. for a polysilicon film 34, and the selectivity of 22 for the polysilicon film 34 to a substrate silicon oxide film 25 were obtained, respectively. An almost perpendicular sectional configuration was obtained as shown in FIG. 2D for the sectional configuration of an object to be etched 36a after etching.

In the 20th and the 21st embodiments, the selectivity of the polysilicon film 34 to a silicon nitride film which is an etching-proof mask 37a and to the substrate silicon oxide film 25 has been improved as compared with the case of the first embodiment by adding rare gas and nitrogen gas to bromine gas. Further, it has been confirmed in the tenth and the 11th embodiments that he uniformity of the etching rate and the selectivity of etching are improved by adding rare gas to bromine gas. Furthermore, although the selectivity was lowered as compared with the cases of the tenth and the 11th embodiments by adding nitrogen gas, the etching rates of the tungsten silicide film 35 and the polysilicon film 34 have been improved. Besides, it is desirable that the oxygen gas does not contain carbon and fluorine.

Further, since no photoresist film is used as the etching-proof mask 37a, it has become possible to prevent formation of a reaction product which is difficult to be removed on a double-layer film composed of a polysilicon film and a metal silicide film similarly to the first embodiment, thereby to secure higher dimensional controllability. Moreover, such a harmful influence that the difference in configuration after etching of this object to be etched 36 depends on the pattern dimensions and the exposed area of the object to be etched 36 which has been a problem in the case of a photoresist film is also reduced.

(10) The 22nd and the 23rd Embodiments

In a 22nd and a 23rd embodiments, a silicon oxide film having a film thickness of approximately 2,000 Å is used as an etching-proof mask 37a and a base substance 21 on which a polysilicon film 34 having a film thickness of approximately 2,000 Å and a tungsten silicide film (a metal polycide film) 35 having a film thickness of approximately 2,000 Å are formed is used as an object to be etched 36 similarly to the first embodiment shown in FIG. 2C. Further, what differs from the first embodiment is the fact that bromine gas added with rare gas and hydrogen gas is used as the reaction gas, and the pressure in the chamber is set to as high as 0.5 Torr.

① The 22nd Embodiment

The 22nd embodiment will be described with reference to FIG. 2C and FIG. 2D. A HBr/He/H₂ gas mixture is used as etching gas, and the flow rates of HBr gas, He gas and H₂ gas are set to 100 SCCM, 20 SCCM and 5 SCCM, respectively. In this case, by applying an etching process similar to that in the first embodiment, the etching rate of 1,900 Å/min. for a tungsten silicide film 35, the etching rate of 2,200 Å/min. for a polysilicon film 34, and the selectivity of 19 for the polysilicon film 34 to a substrate silicon oxide film 25 were obtained, respectively. An almost perpendicular sectional configuration was obtained as shown in FIG. 2D for the sectional configuration after etching of an object to be etched 36a.

① The 23rd Embodiment

The 23rd embodiment will be described with reference to FIG. 2C and FIG. 2D. What differs from the 23rd embodiment is the fact that a HBr/He/H$_2$S gas mixture is used as etching gas (reaction gas), and the flow rate of HBr gas, He gas and NH$_3$ gas are set to 100 SCCM, 20 SCCM and 5 SCCM, respectively. In this case, by applying an etching process similar to that in the first embodiment, the etching rate of 1,900 Å/min. for a tungsten silicide film 35, the etching rate of 2,200 Å/min. for a polysilicon film 34, and the selectivity of 19 for the polysilicon film 34 to a substrate silicon oxide film 25 were obtained, respectively. An almost perpendicular sectional configuration was obtained as shown in FIG. 2D for the sectional configuration of an object to be etched 36a after etching.

In the 22nd and the 23rd embodiments, the selectivity of the polysilicon film 34 to a silicon nitride film which is an etching-proof mask 37a and to the substrate silicon oxide film 25 has been improved as compared with the case of the first embodiment by adding rare gas and hydrogen gas to bromine gas. Further, it has been confirmed in the tenth and the 11th embodiments that the uniformity of the etching rate and the selectivity of etching are improved by adding rare gas to bromine gas. Furthermore, although the selectivity was lowered as compared with the cases of the tenth and the 11th embodiments by adding hydrogen gas, the etching rates of the tungsten silicide film 35 and the polysilicon film 34 have been improved. Besides, it is desirable that the hydrogen gas does not contain carbon and fluorine.

Further, since no photoresist film is used as the etching-proof mask 37a, it has become possible to prevent formation of a reaction product which is difficult to be removed on a double-layer film composed of a polysilicon film and a metal silicide film, thereby to secure higher dimensional controllability similarly to the first embodiment. Moreover, such a harmful influence that the configuration of the object to be etched 36 after etching depends on the pattern dimensions and the exposed area of the object to be etched 36 when a photoresist film is used as an etching-proof mask is also reduced.

The results obtained in the embodiments described above will be extracted and shown collectively ti TABLE 1 to TABLE 3. That is: ① TABLE 1 shows comparison in regard to the relationship among the materials of etching-proof masks and etching rates and selectivity of etching of respective films of the objects to be etched.

TABLE 1

| Etching-proof mask | Photoresist film | CVD-SiO$_2$ film | Si$_3$N$_4$ film |
|---|---|---|---|
| WSi$_x$ film etching rate [Å/min] | — | 2000 | 1750 |
| poly-Si film etching rate [Å/min] | 2400 | 2380 | 2250 |
| SiO$_2$ film etching rate [Å/min] | 300 | 125 | 125 |
| Selectivity (WSi$_x$/SiO$_2$) | — | 16 | 16 |
| Selectivity (poly-Si/SiO$_2$) | 8 | 19 | 18 |

The cases when a silicon oxide film (CVD-SiO$_2$ film) and a silicon nitride film (Si$_3$N$_4$ film) are used as an etching-proof mask are shown. Besides, a photoresist film is inserted as a conventional comparison example.

Further, a case when a tungsten silicide film (a WSi$_x$ film) and a polysilicon film (a poly-Si film) are used as an object to be etched and a silicon oxide film (a SiO$_2$ film) is used as a substrate insulating film is; shown.

Also, a case that HBr gas is used as reaction gas, and etching conditions are made so that the gas flow rate is set to 100 SCCM, pressure in the chamber is set to 0.13 Torr, the RF power is set to 500 W and the substrate temperature is set to 80° C. is shown.

Because of carbon-free or very small amount of carbon, the etching rate of the substrate silicon oxide film is lowered as shown in TABLE 1. On the other hand, the etching rate of the polysilicon film was not lowered comparatively. As a result, the selectivity of etching between the object to be etched and the substrate silicon oxide film was increased.

② TABLE 2 shows comparison in regard to the relationship among the types of reaction gas and etching rates and selectivity of etching of respective films of the objects to be etched.

TABLE 2

| Etching gas | SF$_6$ | Cl$_2$ | HBr |
|---|---|---|---|
| WSi$_x$ film etching rate [Å/min] | 6240 | 4400 | 2000 |
| poly-Si film etching rate [Å/min] | 7800 | 4200 | 2380 |
| SiO$_2$ film etching rate [Å/min] | 1560 | 475 | 125 |
| Selectivity (WSi$_x$/SiO$_2$) | 4 | 9 | 16 |
| Selectivity (poly-Si/SiO$_2$) | 5 | 9 | 19 |

A case that HBr gas is used as reaction gas is shown. Also, the cases that SF$_6$ gas and Cl$_2$ gas are used are shown as comparison examples.

Further, a case that the gas flow rate is set 100 SCCM, the pressure in the chamber is set to 0.13 Torr, the RF power is set to 500 W and the substrate temperature is set to 80° C. as etching conditions is shown.

Furthermore, a case that a CVD-silicon oxide film (a CVD-SiO$_2$ film) is used as the etching-proof mask, a tungsten silicide film (a WSi$_x$ film) and a polysilicon film (a poly-Si film) are used as the object to be etched, and a silicon oxide film (a SiO$_2$ film) is used as the substrate insulating film is shown.

As shown in TABLE 2, the selectivity between the object to be etched (a metal silicide film or a polysilicon film) and the substrate silicon oxide film has been increased as compared with a case of etching using fluorine gas or chlorine gas by using bromine gas as etching gas. Besides, although the etching rate of the metal silicide film was lowered as compared with a case of etching using fluorine gas or chlorine gas by adopting bromine gas as the etching gas, the base substance is heated so as to increase the etching rate.

③ TABLE 3 shows comparison in regard to the relationship between types of gas added to HBr gas and the selectivity of etching.

TABLE 3

| | | Selectivity | | | |
|---|---|---|---|---|---|
| Type of added gas | Added qty. [SCCM] | WSi$_x$/ SiO$_2$ | WSi$_x$/ Si$_3$N$_4$ | poly-Si/ SiO$_2$ | poly-Si/ Si$_3$N$_4$ |
| None | 0 | 16 | 5 | 19 | 6 |
| O$_2$ | 2 | 24 | 8 | 25 | 8 |
| H$_2$ | 5 | 17 | 6 | 20 | 7 |
| N$_2$ | 10 | 21 | 8 | 24 | 8 |

The cases when HBr+O$_2$ mixture gas, HBr+H$_2$ mixture gas or HBr+N$_2$ mixture gas is used as reaction gas are shown, and a case when HBr gas only is used is shown as a comparison example.

Further, a case that the gas flow rate is set to 100 SCCM, the pressure in the chamber is set to 0.13 Torr, the RF power is set to 500 W, and the substrate temperature is set to 80° C. as etching conditions is shown.

Furthermore, a case when a CVD-silicon oxide film (a CVD-SiO$_2$ film) is used as an etching-proof mask is shown.

Further, a case that a tungsten silicide film (a WSi$_x$ film) or a polysilicon film (a poly-Si film) is used as the object to be etched, and a silicon oxide film (a SiO$_2$ film) or a silicon nitride film (Si$_3$N$_4$ film) is used as the substrate insulating film is shown, and comparison is made among the selectivity of etching in the combinations of WSi$_x$ film/SiO$_2$ film, WSi$_x$ film/Si$_3$N$_4$ film, poly-Si film/SiO$_2$ film and poly-Si film/Si$_3$N$_4$ film.

As shown in TABLE 3, the selectivity of etching is improved as compared with the case of the gas loaded with bromine only by using a gas mixture obtained by adding at least one of gas loaded with oxygen, gas loaded with nitrogen and gas loaded with hydrogen to gas loaded with bromine.

As described in the first to the 23rd embodiments, a double-layer film composed of a polycrystal silicon film and a metal silicide film is etched by plasma etching in which a film composed of an inorganic compound or an SOG film is used as the etching-proof film, and bromine gas is used as the etching gas. Thus, it has become possible to form an appropriate protecting film composed of a reaction product containing no carbon and easily removable, thereby to secure higher dimensional controllability.

Moreover, an almost perpendicular sectional configuration is obtainable with respect to the double-layer film composed of a polysilicon film and a metal silicide film by etching while maintaining the substrate temperature at 60° C. or higher. Further, such an effect is produced that the configuration after etching of an object to be etched does not depend on the exposed area of the object to be etched and the pattern dimensions of the etching-proof film but becomes uniform on the wafer surface by etching while maintaining the substrate; temperature at 60° C. or higher. Furthermore, it is possible to maintain the etching rate required practically for the etching of a metal silicide film. Further, it is possible to reduce hours for cleaning the inside of the chamber because an organic adhesive matter does no longer exist. With this, contributions to fine working and improvement in productivity of semiconductor devices are great.

Furthermore, it has become possible to improve the selectivity of etching while improving the uniformity of the etching rate in a wafer because plasma is generated more easily as compared with a case of bromine gas only by adopting a gas mixture obtained by adding rare gas to gas loaded with bromine as reaction gas.

Besides, the plasma processing apparatus for performing dry etching is not necessarily limited to a parallel plane type RIE apparatus used in the embodiments. It is also possible to execute the present invention by using a barrel type RIE apparatus, a magnetron RIE apparatus or a dry etching apparatus using an electron cyclotron resonance (ECR) method.

What is claimed is:

1. A process for dry etching a double-layer film formed on a substrate having a top layer selected from the group consisting of silicon oxide film and silicon nitride film, said double-layer film comprising a polycrystalline silicon film formed on the top layer of the substrate and a metal silicide film formed on the polycrystalline silicon film, the process for dry etching comprising the steps of:

selectively covering the double-layer film with an inorganic etching mask;

activating by plasma discharge a reaction gas consisting of at least one of HBr, Br$_2$, and BBr$_3$; and using the activated reaction gas, selectively etching the double-layer film to leave a portion thereof selectively covered with the inorganic etching mask in a state such that the temperature of said substrate is maintained at 60° C. or higher.

2. A process for dry etching according to claim 1, wherein said metal silicide film is selected from the group consisting of tungsten silicide and molybdenum silicide films.

3. A process for dry etching according to claim 1, wherein said inorganic etching mask is selected from the group consisting of silicon oxide film, silicon nitride film, glass film containing phosphorus, glass film containing boron, and glass film containing phosphorus and boron.

4. A process for dry etching a double-layer film formed on a substrate having a top layer selected from the group consisting of silicon oxide film and silicon nitride film said double-layer film comprising a polycrystalline silicon film formed on the top layer of the substrate and a metal silicide film formed on the polycrystalline silicon film, the process for dry etching, comprising the steps of:

selectively covering the double-layer film with a spin on glass (SOG) film as an etching mask;

activating by plasma discharge a reaction gas consisting of at least one of HBr, Br$_2$ and BBr$_3$; and using the activated reaction gas, selectively etching the double-layer film to leave a portion thereof selectively covered with the etching mask in a state such that a temperature of said substrate is maintained at 60° C. or higher.

5. A process for dry etching according to claim 4, wherein said metal silicide film is selected from the group consisting of tungsten silicide and molybdenum silicide films.

6. A process for dry etching a double-layer film formed on a substrate having a top layer consisting of one of silicon oxide film and silicon nitride file, said double-layer film comprising a polycrystalline silicon film, formed on the top layer of the substrate and a metal silicide film formed on the polycrystalline silicon film, the process for dry etching, comprising the steps of:

selectively covering the double-layer film with an inorganic etching mask;

activating by plasma discharge a reaction gas mixture consisting of a first gas and a second gas, said first gas consisting of at least one of HBr, Br$_2$ and BBr$_3$ and said second gas consisting of at least one of oxygen atom containing compounds; and using the activated reaction gas mixture, selectively etching the double-layer film to leave a portion thereof selectively covered with the inorganic etching mask in a state such that a temperature of said substrate is maintained at 60° C. or higher.

7. A process for dry etching according to claim 6, wherein said metal silicide film is one of tungsten silicide film or a molybdenum silicide film.

8. A process for dry etching according to claim 6, wherein said inorganic etching mask is one of silicon oxide film, silicon nitride film, glass film containing phosphorus, glass film containing boron, and glass film containing phosphorus and boron.

9. A process for dry etching according to claim 6, wherein said second gas consists of at least one of O$_2$, O$_3$, SO$_2$ and H$_2$O.

10. A process for dry etching a double-layer film formed on a substrate having a top layer consisting of one of silicon oxide film and silicon nitride film, said double-layer film comprising a polycrystalline silicon film formed on the top layer of the substrate and a metal silicide film formed on the polycrystalline silicon film, the process for, dry etching, comprising the steps of:

- selectively covering the double-layer film with a spin, on glass (SOG) film as an etching mask;
- activating by plasma discharge a reaction gas mixture consisting of a first gas and a second gas, said first gas consisting of at least one of HBr, $Br_2$ and $BBr_3$ and said gas consisting of at least one of oxygen atom containing compounds; and
- using the activated reaction gas mixture, selectively etching the double-layer film to leave a portion thereof selectively covered with the etching mask of the spin on glass film in a state such that temperature of said substrate is maintained at 600° C. or higher.

11. A process for dry etching according to claim 10, wherein said second gas is is selected from the group consisting of $O_2$, $O_3$ $SO_2$ and $H_2O$ or a gas mixture thereof.

12. A process for dry etching according to claim 10, wherein said metal silicide film is one of tungsten silicide film and molybdenum silicide film.

13. A process for dry etching according to claim 6, wherein said gas loaded with nitrogen consists of at least one of $N_2$, $NH_3$, $N_2H_2$, $NH_3OH$, NO and $N_2O$.

14. A process for dry etching according to claim 6, wherein said gas loaded with hydrogen consists of at least one of $H_2$ and $H_2S$.

15. A process for dry etching according to claim 10, wherein said rare gas consists of at least one of He, Ne, Ar, Kr and Xe.

16. A process for dry etching according to claim 10, wherein said gas loaded with nitrogen consists of at least one of $N_2$, $NH_3$, $N_2H_{21}$ $NH_3OH$, NO and $N_2O$.

17. A process for dry etching according to claim 10, wherein said gas loaded with hydrogen consists of at least one of $H_2$ and $H_2S$.

18. A process for dry etching according to claim 6, wherein said rare gas consists of at least one of He, Ne, Ar, Kr and Xe.

* * * * *

UNITED STATES PATENT AND TRADEMARK OFFICE
CERTIFICATE OF CORRECTION

PATENT NO. : 5,756,401

DATED : May 26, 1998

INVENTOR(S) : Iizuka

It is certified that error appears in the above-identified patent and that said Letters Patent is hereby corrected as shown below:

Col. 1, line 36, "Cl$_2$" should be --C$\ell_2$--.

Col. 2, line 13, "con" should be --on--.

Col. 4, line 52, delete ";".

Col. 6, line 23, "et" should be --a--.

Col. 7, line 1, "film" should be --film 25--.

Col. 11, line 51, delete ",".

Col. 12, line 62, delete ";".

Col. 16, line 22, "he" should be --the--.

Col. 17, line 42, "ti" should be --in--;

line 43, after "That is:" start a NEW PARAGRAPH;

line 65, delete ";".

UNITED STATES PATENT AND TRADEMARK OFFICE
CERTIFICATE OF CORRECTION

PATENT NO. : 5,756,401
DATED : May 26, 1998
INVENTOR(S) : Iizuka

It is certified that error appears in the above-identified patent and that said Letters Patent is hereby corrected as shown below:

Col. 18, line 25, "$Cl_2$" should be --$C\ell_2$--.
Col. 19, line 38, delete ";".
Col. 20, line 38, "file" should be --film--.
Col. 21, line 20, "600" should be --60--.
Col. 22, line 15, "$H_{21}$" should be --$H_2$,--;

Signed and Sealed this

Twenty-seventh Day of October, 1998

Attest:

BRUCE LEHMAN

Attesting Officer

Commissioner of Patents and Trademarks